US006739449B2

(12) United States Patent
Mang et al.

(10) Patent No.: US 6,739,449 B2
(45) Date of Patent: May 25, 2004

(54) STOPPING DEVICE AND METHOD FOR PRINTED CIRCUIT BOARD AUTOMATION MODULES

(75) Inventors: Paul Mang, Taunusstein Bleidenstadt (DE); Gert Wetzel, Oberursel (DE)

(73) Assignee: Mania Technologie Italia SpA, Verona (IT)

( * ) Notice: Subject to any disclaimer, the term of this patent is extended or adjusted under 35 U.S.C. 154(b) by 232 days.

(21) Appl. No.: 09/982,895

(22) Filed: Oct. 22, 2001

(65) Prior Publication Data

US 2002/0060173 A1 May 23, 2002

(30) Foreign Application Priority Data

Nov. 8, 2000  (IT) ..................................... MI2000A2414

(51) Int. Cl.[7] ............................................... B65G 15/00
(52) U.S. Cl. ................................ 198/836.2; 198/459.5; 198/782
(58) Field of Search ........................ 198/832.2, 832.3, 198/836.1, 836.2, 368, 341.09, 345.1, 722, 623, 459.5, 782; 271/235, 236, 242, 243, 244, 245, 246, 182, 202, 233

(56) References Cited

U.S. PATENT DOCUMENTS 3,104,054 A * 9/1963 Rabinow ..................... 234/128
3,951,402 A * 4/1976 Skinner ....................... 271/273
4,163,550 A * 8/1979 Armstrong .................. 271/274
4,189,271 A * 2/1980 Hasegawa ................. 414/789.6
4,203,588 A * 5/1980 Joosten ........................ 271/246
5,094,443 A * 3/1992 Young, Jr. ................... 271/245
6,471,050 B2 * 10/2002 Ikeda et al. ............... 198/861.1
6,505,831 B2 * 1/2003 Henn et al. .................. 271/227

* cited by examiner

*Primary Examiner*—Richard Ridley
(74) *Attorney, Agent, or Firm*—Nixon & Vanderhye, P.C.; Frank P. Presta

(57) ABSTRACT

A stopping device for an automation module for a printed circuit board (PCB) wherein the PCB is stopped in a stopping position and then removed from the stopping position. A stopping means serves to stop in the stopping position a PCB which is fed on a conveyor of the automation module that can impart an acceleration to the PCB. A pressure means is provided to apply pressure on the PCB when it arrives in the vicinity of the stopping position so as to impart a deceleration to the PCB and avoid rebound thereof against the stopping means. The pressure means also applies pressure on the PCB when it is removed from the stopping position by the conveyor to enable the conveyor to impart an acceleration to the PCB.

13 Claims, 2 Drawing Sheets

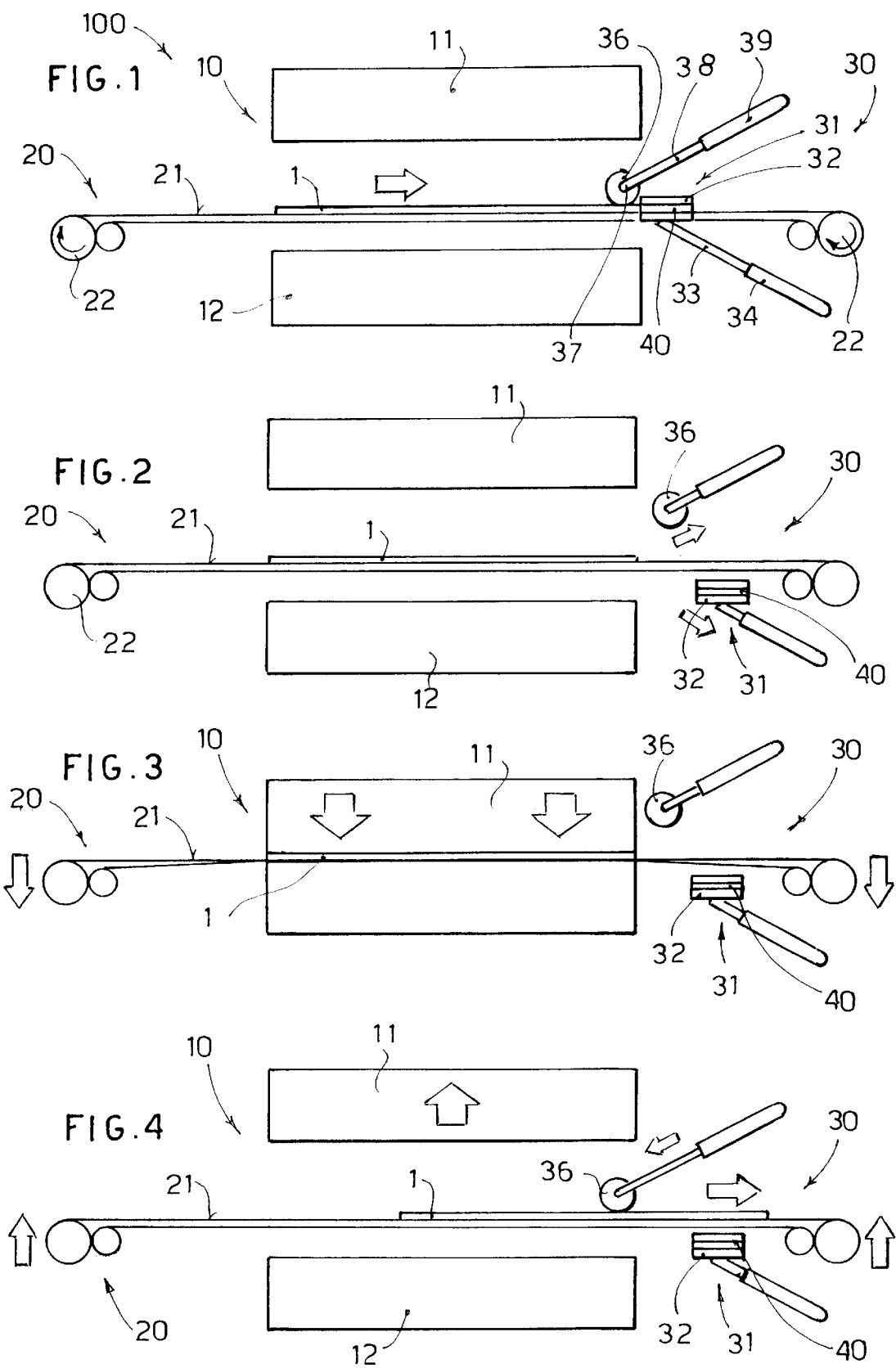

Speed profile of a PCB in a prior art test machine.

Speed profile of a PCB in a test machine equipped
with a stopping and starting device
according to the invention.

STOPPING DEVICE AND METHOD FOR PRINTED CIRCUIT BOARD AUTOMATION MODULES

The present invention refers to a stopping device suitable to be fitted to automation modules for printed circuit boards and in particular to machines for electrical testing of printed circuit boards. The present invention further refers to a method for stopping printed circuit boards.

Specific reference will be made herein to machines for electrical testing of printed circuit boards, it being understood that the stopping and starting device according to the invention can be applied at any point of an automation line for printed circuits at which it is necessary to stop the printed circuit for a particular process and then start it again with a high acceleration. Thus the stopping and starting device according to the invention can be applied, for example, to modules with a telecamera to film the printed circuit and to modules for marking the circuit board.

A printed circuit board (PCB) is a base or substrate of insulating material on which electrical connections of various components which are to be installed generally by welding are traced, normally by a subtractive chemical or etching process.

These printed circuit boards, before application of the components, are tested, that is they are checked and analysed to verify that all the nets present on them are insulated from each other and that there is electrical continuity between all the points in each net.

The electrical test stage of a printed circuit board therefore comes at the end of the manufacturing cycle of the board. The machines used to perform this type of test are normally equipped with a universal contact grid, that is with a constant pitch (generally 100 mils: 2.54 mm) also known by the name of "needle bed" or "needle board".

Since the printed circuit board to be tested has points of connection between the different components disposed in a variable manner—and therefore not referable to a constant pitch grid—an interfacing device (adapter or fixture) that allows an electrical connection to be made between the test points of the printed circuit and the measurement points of the machine is interposed.

Conveyor belts are generally used for automation of the PCBs on test machines. In particular two belts are used which convey the PCBs on both sides.

According to the weight of the PCB and the friction coefficient between the PCB and the belts a limit is defined for the acceleration to be given to the PCB. In fact if an acceleration greater than this limit is imparted, the hold between the surface of the PCB and the belts is lost and the PCB jumps out of the conveyor belts.

Consequently, because of said limit of acceleration, the maximum speed of the PCB is reduced. The maximum speed of the PCB proves to be a very important factor, since the production (number of PCB tested per time unit) of the test machine is given by the speed of travel of the PCBs.

In prior art test machines various devices have been used to optimise acceleration of the PCBs. For example, the use of devices such as pushers and pressure wheels is known to the art.

The pusher is positioned behind the PCB when the PCB is in the stop position. In this manner the pusher pushes on the rear edge of the PCB, in the direction of travel, giving it a high acceleration.

However the pusher is not suitable to be employed in test machines since it interferes with the fixtures and there are difficulties in synchronization between test unit and pusher.

Furthermore the pusher has to be adjusted according to the length of the PCBs processed: this leads to a waste of time at each production change.

The pressure wheel applies pressure on the upper surface of the PCB, imparting an additional force on the belts from the top downward, which is added to the force of the weight of the PCB. Thanks to this force applied by the pressure wheel a greater friction is obtained between the PCB and the belts, thus allowing the PCB to be given a greater acceleration so as to reach a high speed in the shortest time possible.

In prior art test machines, stopping devices are used to stop the PCB, for example when it reaches the vicinity of the test area. The stopping devices of the prior art have moveable stoppers. The stopper is moved toward the belts so that the PCB hits against it. In this case the PCB travelling at high speed bounces backward off the stopper and then stops in abutment against the stopper. To avoid this rebound another solution provides for the belts to decelerate when the PCB is in the vicinity of the stopper.

Both systems have the drawback of wasting too much time and thus increasing the production cycle time.

In fact the rebound of the PCB against the stopper causes a waste of time due to its backward and subsequent forward movement, and the deceleration of the belts must be gradual, according to the friction coefficient between belt and PCB, otherwise if the acceleration is too sharp the PCB could jump out of the belts.

To resume forward movement of the PCB, the stopper is moved away and thus the belts carry the PCB forward. In this case too there is a waste of time, since the acceleration to be imparted to the PCB on restarting is again limited by the friction coefficient between the PCB and the belts.

In prior art test machines it is evident that much of the cycle time of the machine is wasted in idle time before and after stopping of the PCB.

The object of the present invention is to eliminate the drawbacks of the prior art, providing a stopping device for automation modules of printed circuit boards that is able to minimize idle times before and after stopping and is efficient, versatile, practical and simple to make.

This object is achieved according to the invention with the characteristics listed in appended independent claim 1.

Another object of the invention is to provide a method for stopping the printed circuit boards that allows the cycle time of the machine to be reduced and the production per unit of time to be increased.

This object is achieved in accordance with the invention with the characteristics listed in appended independent claim 1.

Advantageous embodiments of the invention are apparent from the dependent claims.

The stopping device for printed circuit board automation modules according to the invention provides at least one stopper to stop the PCB and at least one pressure means which acts on the PCB when it abuts against the stopper to prevent it from rebounding.

When the PCB has to move on from its stopping position, the pressure means, which is advantageously a wheel, comes into action again applying pressure on the PCB so as to accelerate it.

Said solution allows the rebound of the PCB against the stopper to be eliminated, a high deceleration of the PCB to be obtained when it arrives in the stopping position and a high acceleration of the PCB to be obtained on restarting. All this enables the machine cycle to be speeded up, thus increasing production.

Furthermore, with said solution the use of pushers with all the related drawbacks is eliminated.

Further characteristics of the invention will be made clearer by the detailed description that follows, referring to a purely exemplary and therefore non-limiting embodiment thereof, illustrated in the appended drawings, in which:

FIG. 1 is a diagrammatic side view schematically illustrating the stopping device according to the invention during the stage of stopping a PCB, in the vicinity of a fixture of an electrical test machine;

FIGS. 2–4 are diagrammatic views, like FIG. 1, illustrating the stopping device in successive stages of the electrical test machine cycle.

Figure 5A:
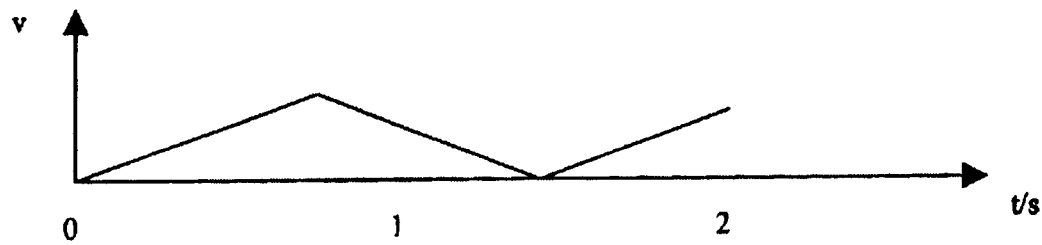
FIGS. 5a and 5b are two graphs illustrating the mean speed profile of a PCB, respectively in a test machine and in a test machine equipped with the stopping device according to the invention.

A stopping device according to the invention will be described with the aid of the figures.

FIG. 1 diagrammatically shows a portion of an automatic machine for the electrical test on printed circuit boards (PCB). The machine is designated as a whole with reference numeral 100.

The test machine 100 comprises an electrical test unit 10 consisting of a universal contact grid for checking the open and closed circuits on a PCB 1, a conveyor 20 for conveying the PCBs toward the test unit 10, a loader (not shown) for loading the PCBs onto the conveyor 20 and an unloader (not shown) for unloading the PCBs from the conveyor 20, after the electrical test has been performed.

The conveyor 20 is preferably a belt conveyor comprising two belts 21 arranged parallel to support both side edges of the PCBs 1. The belts 21 are endless belts and are operated by drive roller 22.

The electrical test unit 10 comprises interfacing devices or fixtures for adapting the universal contact grid to the PCBs 1.

In particular, FIG. 1 shows a top fixture 11 disposed above the plane of the belts 21 and a bottom fixture 12 disposed below the plane of the belts 21.

The test machine 100 comprises a stopping device 30 according to the invention.

The stopping and starting device 30 comprises a stopper 31 which is moved toward the belts 21 of the conveyor 20 at the position in which the PCB 1 must be stopped. In this manner the PCB 1 is stopped, abutting against the stopper 31.

The stopper 31 can be made by means of one or more stopping plates 32 driven by means of an actuator. The actuator can be of the linear type comprising a piston 33 sliding inside a cylinder 34 fixed to the frame of the conveyor belt system 100. In place of the stopping plates 32, two stopping pins acting in the vicinity of the two belts 21, respectively, can be provided.

When the piston 33 is the extracted position outside the cylinder 34, the stopping plate 32 is in such a position (FIG. 1) as to interfere with forward movement of the PCB 1 conveyed by the belts 21. When the piston 33 is in a retracted position inside the cylinder 34, the stopping plate 32 is in such a position (FIGS. 2–4) as not to interfere with advancement of the PCB 1 conveyed by the belts 21.

In a test machine of this type, the PCB is loaded by the loader onto the conveyor 20, conveyed into the test area in which it is stopped by the stopper 31 and undergoes the electrical test. On completion of the electrical test, the PCB is removed from the test area by the conveyor 20, and conveyed to the unloading device which sends it to unloading or possibly to a subsequent process.

Because of the limited frictional force between the PCB and the belts 21 of the conveyor 20 the acceleration given by the belts 21 to the PCB 1 must be reduced.

In order to increase the permissible acceleration, the friction between the PCB and the belts 21 must be increased and this is achieved by means of pressure wheels. Said pressure wheels rest on the upper surface of the PCB, generating a greater pressure of the PCB on the belts. Thanks to this increase in friction between the PCB and the belts, a greater acceleration and thus a higher average speed can be imparted to the PCB, resulting in an increase in production.

The deceleration of the PCB must also be limited because of the low frictional force between the PCB and the belts. Decelerations that are too sharp cause detachment of the PCB from the belts 21 because of the inertia of the PCB.

However, if a deceleration of the PCB 1 is not brought about, when it arrives in front of the stopper 31, there is a rebound of the PCB 1 which hits against the stopping plate 32 of the stopper 31. This rebound is caused by the kinetic energy accumulated by the PCB which is conveyed at high speed by the belts 21.

Clearly the rebound of the PCB affects the time of the production cycle, as does the deceleration of the PCB, which cannot be a sharp deceleration, otherwise the grip between the belts 21 and PCB 1 would be lost.

To overcome these drawbacks the stopping and starting device 30, according to the invention, comprises a pressure wheel 36 which is positioned in front of the stopper 31. Said pressure wheel 36, by compressing the PCB 1 from the top downward, increases the pressure of the PCB on the belts 21, and thus the friction between the PCB 1 and the belts 21. Consequently, when the PCB 1 strikes against the stopping plate 32 of the stopper 31, it does not suffer a rebound, even if its speed is high. Furthermore, thanks to the action of the pressure wheel, the PCB, when it abuts against the stopper, can undergo an extremely sharp deceleration without the risk of becoming detached from the belts 21.

The pressure wheel 36 can be made by means of one or a plurality of wheels or rollers rotatably mounted on a pivot axis 37. The pivot or pin 37 is supported at its ends by pistons 38 sliding in respective cylinders 39. In this manner, when the pistons 38 are in a position extended from the cylinders 39 the pressure wheel 36 rests against the upper surface of the PCB 1 applying a certain pressure. On the other hand, when the pistons 38 are in a retracted position inside the cylinders 39 the pressure wheel 36 is away from the area in which the PCB 1 passes on the belts 21. The cylinder 39 is driven pneumatically or hydraulically to operate the piston 38.

Instead of wheels 36 rotatably mounted on pivot axis 37, sliding cams that come to bear against the upper surface of the PCB 1 generating sliding friction can be provided.

The movement of the pressure wheel 36 is independent of the movement of the stopper 31. To optimise the movements of the stopping device with respect to the test unit 10, a sensor or micro switch 40 is implemented inside the stopper 31 to check whether the PCB 1 has arrived in the correct position above the bottom fixture 12. The switch 40 enables closure of the fixtures 11 and 12 in order to perform the electrical test.

The operating cycle of the test machine 100 provided with the stopping device 30 according to the invention is now described.

A stack of PCBs is positioned in the loading module that separates the individual PCBs, feeding them one at a time onto the conveyor module 20. The belts 21 of the conveyor 20 convey the PCB 1 into the test area between the upper fixture 11 and the lower fixture 12.

At this point the stopping device 30 intervenes. That is to say both the pressure wheel 36 and the stopper 31 are in their extracted position (FIG. 1). Thus the front edge of the PCB 1 abuts against the stopping plate 32 of the stopper and the pressure wheel 36 presses on the upper surface of the PCB 1 avoiding rebound of the PCB against the stopping plate 32.

At the same time the switch 40 checks that the plate 1 is in the correct position above the bottom fixture 12 and sends an enabling signal to the test unit 10.

As shown in FIG. 2, after the PCB 1 has been stopped in the correct position, both the pressure wheel 36 and the stopping plate 32 are retracted to leave the test area and allow closure of the fixtures. That is to say, the pistons 38 and 33 are recalled inside the respective cylinders 39 and 34.

At this point, as shown in FIG. 3, the top and bottom fixtures 11 and 12 are closed on the PCB 1 and the electrical test is performed.

Once the electrical test has been completed, as shown in FIG. 4, the top and bottom fixtures 11 and 12 open and at the same time the pressure wheel 36 is returned to the extracted position. That is to say, the piston 38 is extracted from the cylinder 39 and the pressure wheel presses on the upper surface of the PCB 1.

At this point, thanks to the action of the pressure wheel 36, a high acceleration can be given to the PCB by means of the belts 21. Thus the PCB 1 resumes travel, leaving the test area with a very high acceleration.

The conveyor 20 conveys the PCB toward the unloading module which is responsible for positioning it on a pile of other PCBs according to the outcome of the electrical test. Two different piles are generally provided: one for PCBs that have passed the electrical test and another for PCBs which have had a negative result during the electrical test.

Figure 5B:
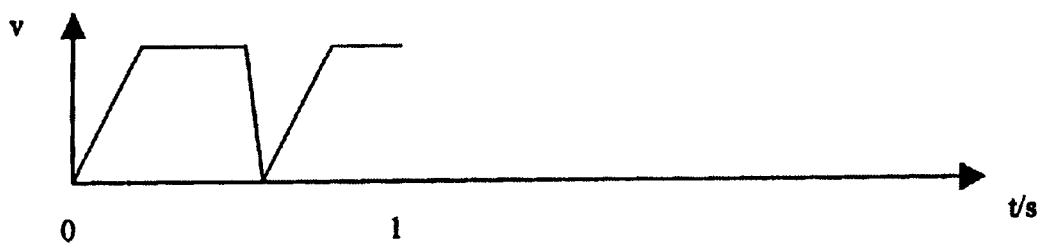

With the aid of FIGS. 5a and 5b the mean speed of travel of a PCB during a machine cycle is compared in a test machine according to the prior art and in a test machine provided with the stopping device according to the invention.

As shown in FIG. 5a, in a test machine according to the prior art the speed profile of a PCB during the machine cycle has a periodic pattern (if the testing time is not considered). The period of the speed profile is shaped substantially like an isosceles triangle with the oblique sides having a gentle slope.

This means that the PCB undergoes a slight deceleration when it stops in the test area and a slight acceleration when it is ejected from the test area. In fact the speed profile is influenced by the limited deceleration of the PCB entering the test area, by the rebound of the PCB against the stopper and by the limited acceleration of the PCB leaving the test area. The mean cycle time for this test machine according to the prior art could be about 2 seconds.

As shown in FIG. 5b, in a test machine equipped with the stopping and starting device 30 according to the invention, the speed profile of a PCB during the machine cycle has a periodic pattern (if the testing time is not considered). The period of the speed profile is shaped like a scalene trapeze with the oblique sides having a steep slope.

This means that the PCB undergoes a high deceleration when it stops in the test area and a high acceleration when it leaves the test area. In this case, thanks to the intervention of the pressure wheel 36 of the stopping device 30, the speed profile is not influenced by the rebound of the PCB against the stopper and is instead influenced by a high deceleration of the PCB entering the test area, and by a high acceleration of the PCB leaving the test area. The mean cycle time for the test machine according to the invention could be about 1 second, that is to say, half the cycle time of a machine according to the prior art.

Numerous variations and modifications known to a person skilled in the art can be made to the present invention, without thereby departing from the scope of the invention set forth in the appended claims.

What is claimed is:

1. A stopping device (30) for an automation module for a printed circuit board (PCB), wherein the PCB is stopped in a stopping position and then removed from said stopping position, comprising stopping means (31) to stop in said stopping position a PCB (1) which is fed on a conveyor (20) of said automation module that can impart an acceleration to the PCB, characterized in that it further comprises pressure means (36) to apply pressure on said PCB (1) when it arrives in the vicinity of said stopping position, so as to impart a deceleration to the PCB and avoid rebound thereof against said stopping means (31), said pressure means (36) also applying pressure on said PCB (1) when it is removed from said stopping position by said conveyor, to enable said conveyor (20) to impart an acceleration to the PCB (1).

2. A device (30) according to claim 1, characterized in that said conveyor (20) is a belt conveyor comprising a pair of side belts (21) freely supporting the PCB.

3. A device according to claim 1, characterized in that said pressure means comprise at least one pressure wheel (36), rotatably mounted on a pivot axis (37), to be able to act with rolling friction on the upper surface of the PCB (1) conveyed by the conveyor (20).

4. A device according to claim 1, characterized in that said pressure means (36) comprise at least one sliding cam able to act with sliding friction on the upper surface of the PCB (1) conveyed by the conveyor (20).

5. A device according to claim 1, characterized in that said pressure means (36) is driven by a linear actuator (38, 39) comprising at least one piston (38) sliding in a corresponding cylinder (39) mounted fixedly on the frame of the automation module to be able to be brought from an operating position in which said pressure means exerts pressure on said PCB (1) to a resting position in which said pressure means is moved away from said PCB stopping position.

6. A device according to claim 1, characterized in that said stopping means (31) comprise at least one stopping plate (32) movable into the path of the PCB to interrupt its forward travel.

7. A device according to claim 6, characterized in that said stopping means (31) are driven by a linear actuator comprising at least one piston (33) sliding inside a respective cylinder (34).

8. A device according to claim 1, characterized in that said stopping means (31) comprise detection means (40) able to detect when the PCB (1) is in the correct stopping position.

9. A device according to claim 8, characterized in that said detection means (40) comprise a microswitch that detects when said PCB is in abutment against said stopping means (31).

10. A device according to claim 1, characterized in that it is mounted in a test area of a machine (100) for electrical testing of the PCB.

11. A device according to claim 1, characterized in that it is mounted on an automation module for printed circuits which has a stopping area for filming of the circuit with a telecamera.

12. A device according to claim 1, characterized in that it is mounted in an automation module for printed circuit boards which has a stopping area for the circuit for marking thereof.

13. a method for stopping a printed circuit board (PCB) (1) travelling on a conveyor (20) of an automation module for PCBs comprising the following steps:
- stopping the PCB in a stopping position, by interposing a stopping means (32) in the path thereof, which stops its forward movement, and
- removing said PCB (1) from said stopping position, by acceleration imparted to the PCB (1) by said conveyor (20), characterized in that during stopping and removal of the PCB pressure is applied to said PCB (1), to impart thereto a deceleration and a an acceleration, respectively.

* * * * *